(12) United States Patent  
Sutardja

(10) Patent No.: US 7,276,965 B1  
(45) Date of Patent: Oct. 2, 2007

(54) NESTED TRANSIMPEDANCE AMPLIFIER

(75) Inventor: Sehat Sutardja, Los Altos Hills, CA (US)

(73) Assignee: Marvell International Ltd., Hamilton (BM)

( * ) Notice: Subject to any disclaimer, the term of this patent is extended or adjusted under 35 U.S.C. 154(b) by 420 days.

(21) Appl. No.: 10/459,731

(22) Filed: Jun. 11, 2003

Related U.S. Application Data

(63) Continuation-in-part of application No. 10/072,843, filed on Feb. 6, 2002, now Pat. No. 6,762,644.

(60) Provisional application No. 60/275,109, filed on Mar. 13, 2001.

(51) Int. Cl.  
*H03F 1/24* (2006.01)

(52) U.S. Cl. .......................... 330/98; 330/99; 330/100; 250/214 A

(58) Field of Classification Search .................. 330/69, 330/98, 99, 100; 250/214 A; 360/77.02  
See application file for complete search history.

(56) References Cited

U.S. PATENT DOCUMENTS

| | | | |
|---|---|---|---|
| 4,535,233 A | | 8/1985 | Abraham |
| 4,564,818 A | | 1/1986 | Jones |
| 4,724,315 A | | 2/1988 | Goerne |
| 4,731,590 A | * | 3/1988 | Saari ........................... 330/278 |
| 4,764,732 A | | 8/1988 | Dion |
| 4,772,859 A | | 9/1988 | Sakai |
| 4,914,402 A | | 4/1990 | Dermitzakis et al. |
| 4,919,534 A | * | 4/1990 | Reed ........................... 356/73 |
| 5,010,588 A | | 4/1991 | Gimlett |
| 5,155,455 A | * | 10/1992 | Cowley et al. ............. 332/120 |
| 5,345,073 A | | 9/1994 | Chang et al. |
| 5,382,920 A | | 1/1995 | Jung |
| 5,532,471 A | | 7/1996 | Khorramabadi et al. |
| 5,646,573 A | | 7/1997 | Bayruns et al. |
| 5,793,230 A | * | 8/1998 | Chu et al. ...................... 327/77 |
| 6,037,841 A | | 3/2000 | Tanji et al. |
| 6,057,738 A | | 5/2000 | Ku et al. |
| 6,084,478 A | | 7/2000 | Mayampurath |
| 6,114,913 A | | 9/2000 | Entrikin |
| 6,122,131 A | | 9/2000 | Jeppson |

(Continued)

FOREIGN PATENT DOCUMENTS

| JP | 406061752 A | 3/1994 |
|---|---|---|
| JP | H6-61752 | 3/1994 |

OTHER PUBLICATIONS

Charles A. Holt, "Electronic Circuits Digital and Analog", by John Wiley & Sons, Inc., 1978, pp. 423, 431, and 436.  
You et al., SA 21.2 "A Multistate Amplifier Topology with Nested Gm-C Compensation for Low-Voltage Application", IEEE International Solid-State Circuits Conference, Digest of Technical Papers, ISSCC97, Feb. 8, 1997, pp. 348-349.

(Continued)

*Primary Examiner*—Patricia Nguyen

(57) ABSTRACT

A nested transimpedance amplifier (TIA) circuit includes a zero-order TIA having an input and an output. A first operational amplifier (opamp) has an input that communicates with the output of the zero-order TIA and an output. A first feedback resistance has one end that communicates with the input of the zero-order TIA and an opposite end that communicates with the output of the first opamp. A first feedback capacitance has a first end that communicates with the input of the zero-order TIA and a second end that communicates with the output of the zero-order TIA. A capacitor has one end that communicates with the input of the zero-order TIA.

60 Claims, 19 Drawing Sheets

U.S. PATENT DOCUMENTS

| | | | |
|---|---|---|---|
| 6,292,052 B1 * | 9/2001 | Carlson | 330/9 |
| 6,330,279 B1 * | 12/2001 | Belser et al. | 375/238 |
| 6,353,324 B1 * | 3/2002 | Uber et al. | 324/457 |
| 6,466,091 B1 | 10/2002 | Kejariwal et al. | |
| 6,515,540 B1 | 2/2003 | Prasad et al. | |
| 6,525,589 B1 | 2/2003 | Thomsen et al. | |
| 6,593,810 B2 * | 7/2003 | Yoon | 330/69 |
| 6,642,496 B1 * | 11/2003 | Gulbransen | 250/208.1 |

OTHER PUBLICATIONS

W. Grise, Dept. of IET, Morehead State University, Morehead, KY; Application of the Operational Transconductance Amplifier (OTA) to Voltage-controlled Amplifiers and Active Filters; 10 pages.

Axel Thomsen, Dan Kasha, Wai Lee, Crystal Semiconductor Division, Cirrus Logic, Inc., Austin, Texas; A Five Stage Chopper Stabilized Instrumentation Amplifier Using Feedforward Compensation; 1998; 4 pages.

Axel Thomsen, Edwin de Angel, Sherry Ziachong Wu, Aryesh Amar, Lei Wang, Wai Lee, WA 20.1 A DC Measurement IC with 130nV$_{pp}$ Noise in 10Hz; 2000 IEEE International Solid-State Circuits Conference; 9 pages.

Axel Thomsen, Edwin de Angel, Sherry Ziachong Wu, Aryesh Amar, Lei Wang, Wai Lee, WA 20.1 A DC Measurement IC with 130nV$_{pp}$ Noise in 10Hz; ISSCC 2000/Session 20/Oversampled Converters/ Paper WA 20.1 ISSCC 2000 Slide Supplement; 5 pages.

M. Moyal, M. Groepl, H. Werker, G. Mitteregger, J. Schambacher; Xignal Technologies AG, Munich, Germany; 23.6 A 700/900mW/ Channel CMOS Dual Analog Front-End IC for VDSL with Integrated 11.5/14.5dBm Line Drivers; 2003 IEEE International Solid-State Circuits Conference; ISSCC 2003/Session 23/Mixed-Signal and Wireline Techniques; 10 pages.

M. Moyal, M. Groepl, H. Werker, G. Mitteregger, J. Schambacher; Xignal Technologies AG, Munich, Germany; A 700/900mV/Channel CMOS Dual Analog Front-End IC for VDSL with Integrated 11.5/14.5dBm Line Drivers; Outline, Overview 24 pages.

* cited by examiner

NESTED TRANSIMPEDANCE AMPLIFIER

CROSS-REFERENCE TO RELATED APPLICATIONS

This application is a continuation-in-part of U.S. patent application Ser. No. 10/072,843 filed on Feb. 6, 2002 now U.S. Pat. No. 6,762,644, which claims the benefit of U.S. Provisional Application No. 60/275,109, filed Mar. 13, 2001, both of which are hereby incorporated by reference in their entirety.

FIELD OF THE INVENTION

The present invention relates to transimpedance amplifiers, and more particularly to nested transimpedance amplifiers with an increased gain-bandwidth product.

BACKGROUND OF THE INVENTION

A transimpedance amplifier (TIA) is a well-known type of electronic circuit. Referring now to FIG. 1, a TIA 100 includes an operational amplifier (opamp) 105 having a gain parameter ($-g_m$). The opamp 105 is connected in parallel to a resistor ($R_f$) 110. The input to the TIA 100 is a current ($\Delta i$) 115. The output of the TIA 100 is a voltage ($\Delta v_o$) 120.

Referring now to FIG. 2, the opamp 105 of the TIA 100 is replaced by a current source 205 and a transistor 210 having gain $-g_m$. The TIA 100 in FIGS. 1 and 2 is often referred to as a transconductance amplifier because it converts the input current $\Delta i$ into the output voltage $\Delta v_o$.

Referring now to FIG. 3, a TIA 300 converts an input voltage ($\Delta v_i$) 305 into an output voltage ($\Delta v_o$) 310. The TIA 300 also includes a resistor 315 that is connected to a transistor 320. The TIA 300 is typically used in applications that require relatively low bandwidth.

Referring now to FIG. 4, a TIA 400 converts an input voltage ($\Delta v_i$) 405 into an output voltage ($\Delta v_o$) 410. The TIA 400 includes a second opamp 415, which is connected in series to a parallel combination of a resistor ($R_f$) 420 and an opamp 425. The TIA 400 is typically used for applications having higher bandwidth requirements than the TIA 300.

Ordinarily, the bandwidth of the TIA is limited to a fraction of a threshold frequency $f_T$ of transistor(s) that are used in the opamp(s). In the case of a bipolar junction transistor (BJT) such as a gallium-arsenide (GaAs) transistor, the bandwidth of the TIA is approximately equal to 10%–20% of $f_T$. For metal-oxide-semiconductor (MOS) transistor(s), the bandwidth of the TIA is typically a few percent (i.e., approximately 2%–6%) of $f_T$.

Referring now to FIG. 5, a TIA 500 may be configured to operate differentially using two inputs of each opamp 502 and 504. One input 505 acts as a reference, in a similar manner as ground or virtual ground in a standard configuration TIA. The input voltage $\Delta v_i$ and the output voltage $\Delta v_o$ are measured as voltage differences between a reference input 505 and a second input 510. Feedback resistors 514 and 516 are connected across the inputs and the outputs of the opamp 504.

Referring now to FIG. 6, one TIA application having a relatively high bandwidth requirement is that of an optical sensor. An optical sensor circuit 600 includes the opamp 105 and the resistor 110 of the TIA 100 that are coupled with a photodiode 605. The output of the photodiode 605 is a current $I_{photo}$ 610, which acts as an input to the TIA 100.

Increasingly, applications require both high bandwidth and high gain. Examples include optical sensors, such as fiber optic receivers, and preamplifier writers for high-speed hard disk drives. Efforts to increase the gain-bandwidth product of TIAs have been made. For example, in U.S. Pat. No. 6,114,913, which are hereby incorporated by reference, a boost current is used to increase the gain-bandwidth product in the TIA. Cascading TIA stages is also used in U.S. Pat. Nos. 5,345,073 and 4,772,859, which are hereby incorporated by reference.

Other improvements to TIAs are the subject of other patents, such as U.S. Pat. Nos. 6,084,478; 6,057,738; 6,037,841; 5,646,573; 5,532,471; 5,382,920; 5,010,588; 4,914,402; 4,764,732; 4,724,315; 4,564,818; and 4,535,233, which are hereby incorporated by reference. However, improving the gain-bandwidth product of TIAs continues to be a challenge for circuit designers.

SUMMARY OF THE INVENTION

A nested transimpedance amplifier (TIA) circuit according to the present invention includes a zero-order TIA having an input and an output. A first operational amplifier (opamp) has an input that communicates with the output of the zero-order TIA and an output. A first feedback resistance has one end that communicates with the input of the zero-order TIA and an opposite end that communicates with the output of the first opamp. A first feedback capacitance has a first end that communicates with the input of the zero-order TIA and a second end that communicates with the output of the zero-order TIA.

In other features, a capacitor has one end that communicates with the input of the zero-order TIA. The zero order TIA includes a second opamp having an input and an output. A third opamp has an input that communicates with the output of the second opamp and an output. A second feedback resistance has one end that communicates with the input of the third opamp and an opposite end that communicates with the output of the third opamp.

In yet other features, a fourth opamp has an input and an output that communicates with the input of the second opamp. A fifth opamp has an input that communicates with the output of the first opamp and an output. A second feedback capacitance has a first end that communicates with the input of the fourth opamp and a second end that communicates with the output of the first opamp. A third feedback resistance has one end that communicates with the input of the fourth opamp and an opposite end that communicates with the output of the fifth opamp.

In still other features, at least one higher order circuit is connected to the nested TIA circuit and includes an $n^{th}$ feedback resistance, an $n^{th}$ opamp, an $(n+1)^{th}$ opamp, and an $n^{th}$ feedback capacitance.

In yet other features of the invention, a nested differential mode TIA circuit includes a zero-order differential mode TIA having first and second inputs and first and second outputs. A first differential mode opamp has first and second inputs that communicate with the first and second outputs of the zero-order differential mode TIA and first and second outputs. A first feedback resistance has one end that communicates with the first input of the zero-order differential mode TIA and an opposite end that communicates with the first output of the first differential mode opamp. A second feedback resistance has one end that communicates with the second input of the zero-order differential mode TIA and an opposite end that communicates with the second output of the first differential mode opamp. A first capacitance has a first end that communicates with the first input of the zero-order differential mode TIA and a second end that communicates with the first output of the zero-order differential mode TIA. A second capacitance has a first end that communicates with the second input of the zero-order differential mode TIA and a second end that communicates with the second output of the zero-order differential mode TIA.

In still other features, the zero order differential mode TIA includes a second differential mode opamp having first and second inputs and first and second outputs. A third differential mode opamp has first and second inputs that communicate with the first and second outputs of the second differential mode opamp and first and second outputs. A third feedback resistance has one end that communicates with the first input of the third differential mode opamp and an opposite end that communicates with the first output of the third differential mode opamp. A fourth feedback resistance has one end that communicates with the second input of the third differential mode opamp and an opposite end that communicates with the second output of the third differential mode opamp.

In still other features, at least one higher order circuit is connected to the nested TIA circuit and includes an $n^{th}$ feedback resistance, an $(n+1)^{th}$ feedback resistance, an $n^{th}$ differential mode opamp and an $n^{th}$ feedback capacitance.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 15:
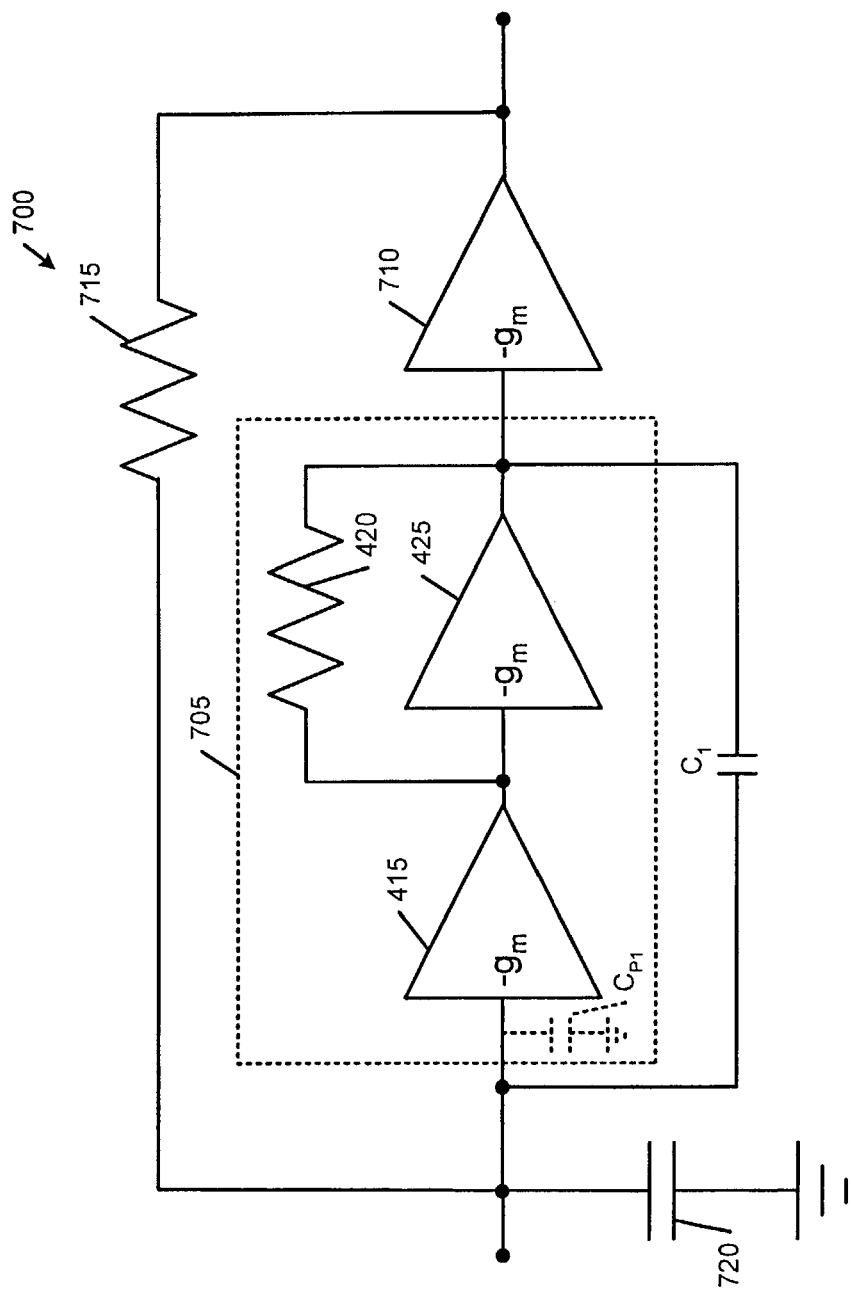
FIG. 15 is a first-order nested TIA with capacitive cancellation of input parasitic capacitance according to the present invention.
Figure 16:
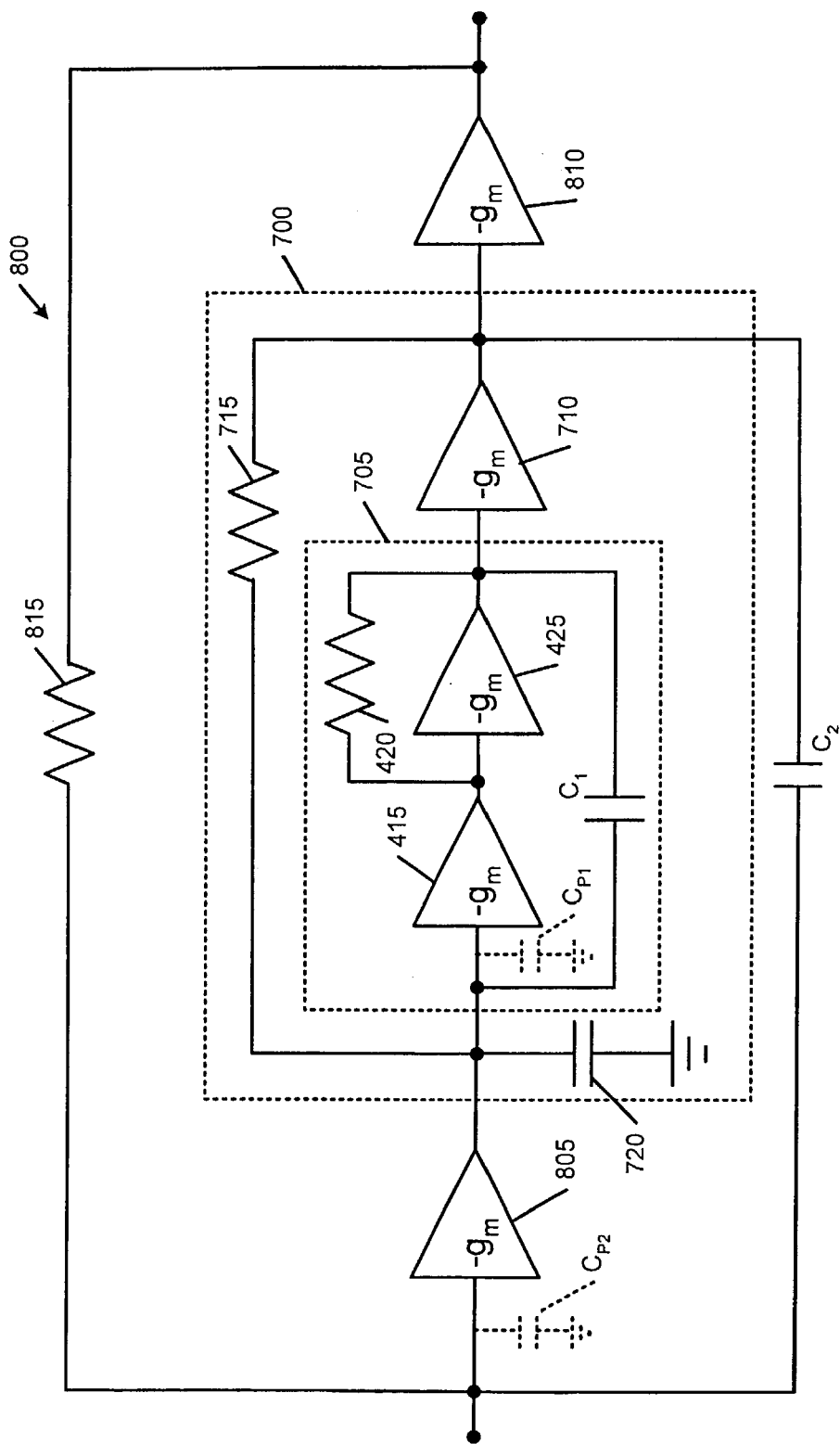
FIG. 16 is a second-order nested TIA with capacitive cancellation of input parasitic capacitance according to the present invention.
Figure 17:
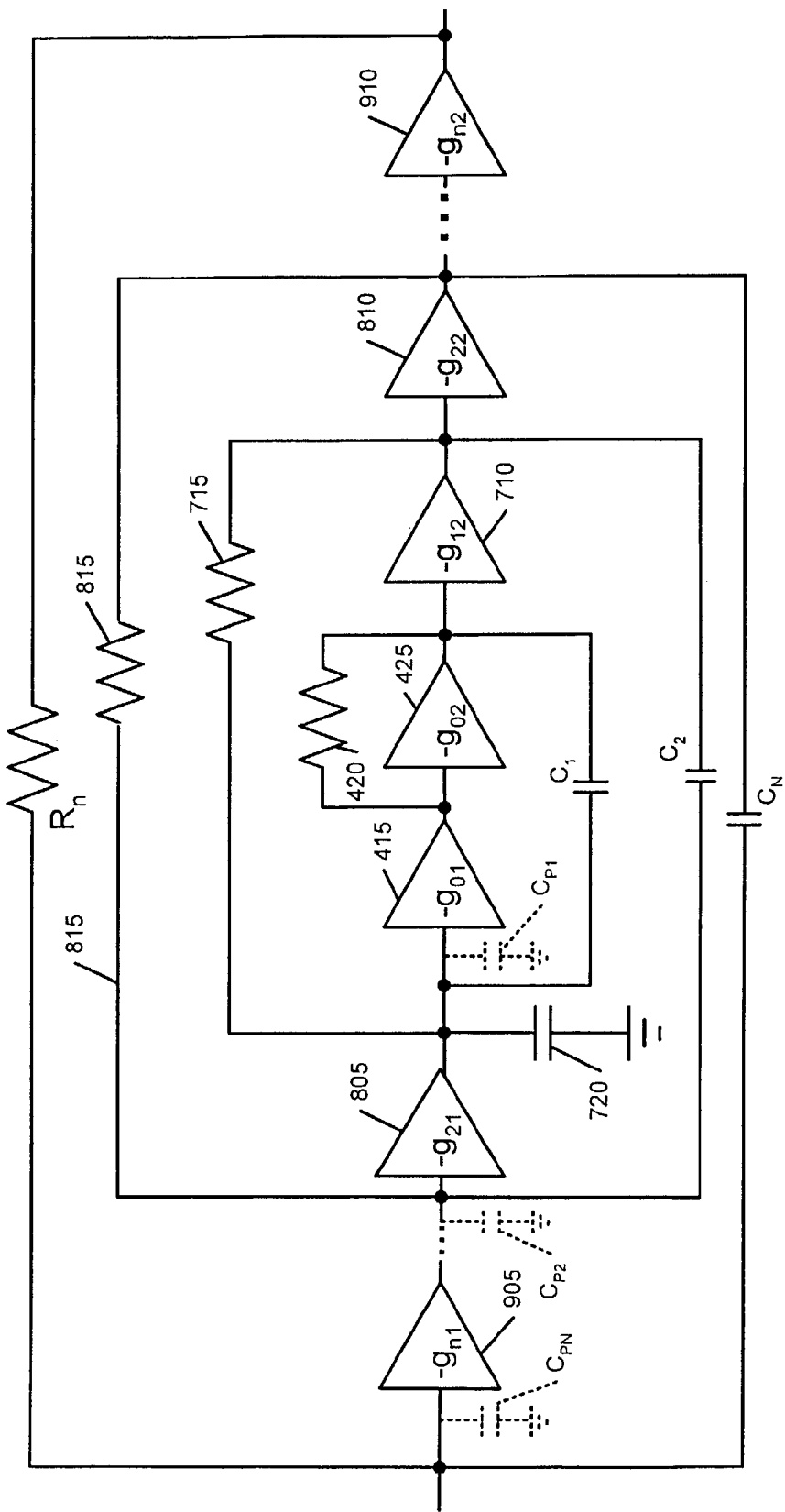
FIG. 17 is an nth-order nested TIA with capacitive cancellation of input parasitic capacitance according to the present invention.
Figure 23:
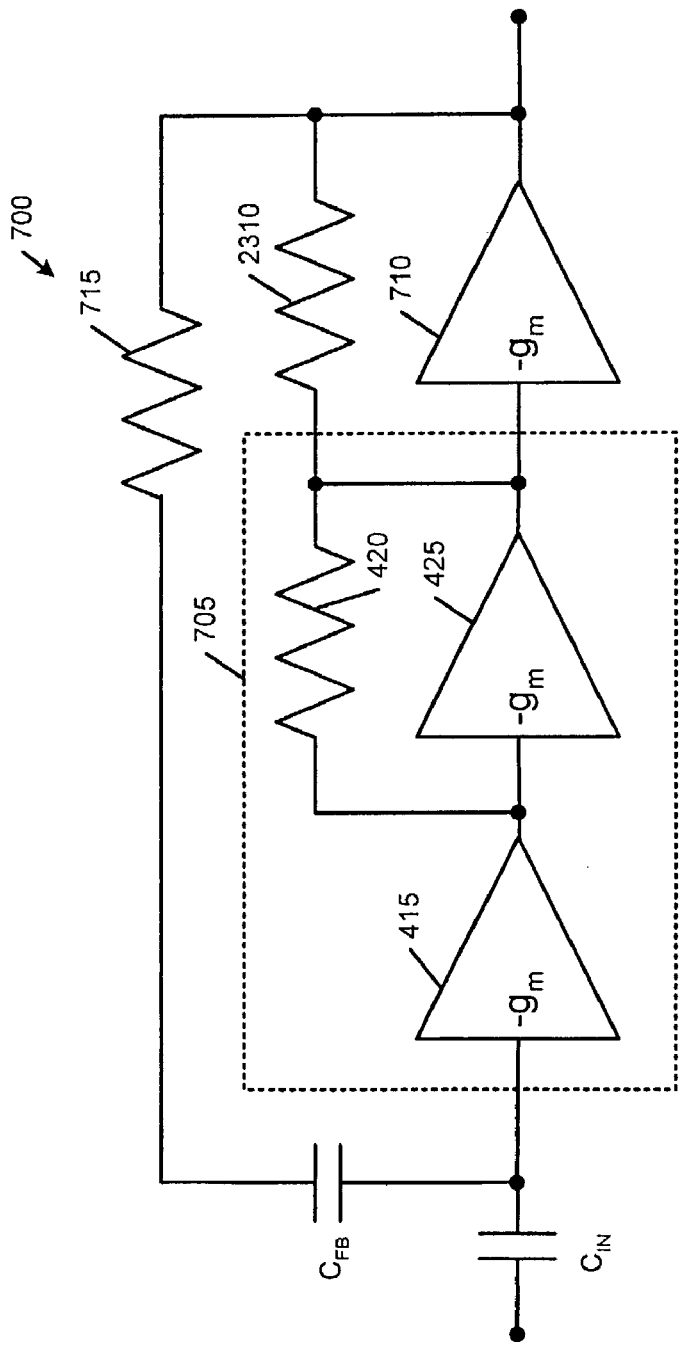
FIG. 23 illustrates the first order nested TIA of FIG. 7 with an additional input capacitance, feedback capacitance, and feedback resistance.
Figure 24:
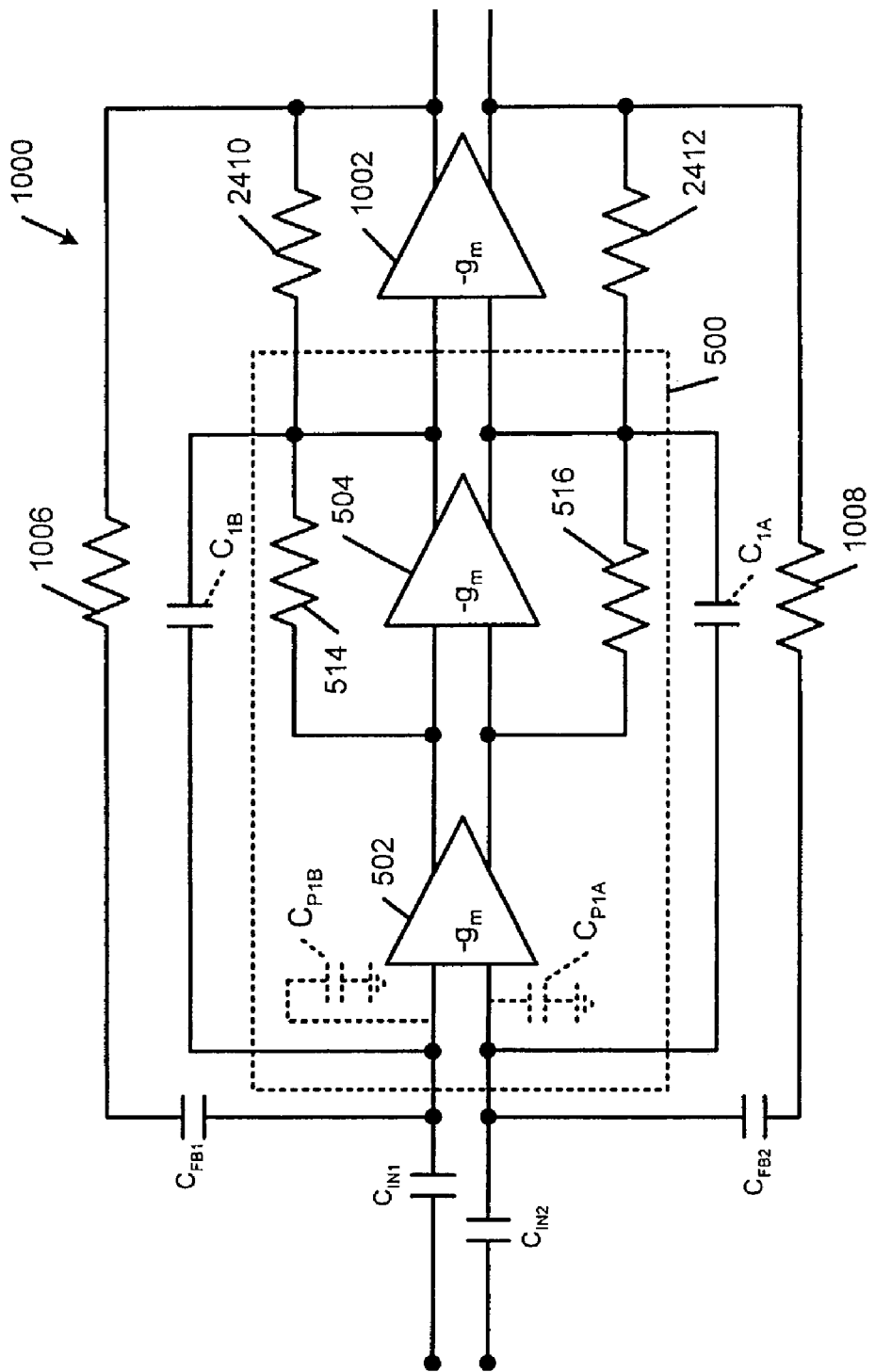
FIG. 24 illustrates the first order differential mode TIA of FIG. 10 with an additional input capacitance, feedback capacitance, and feedback resistance.

The present invention addresses the need for increasing the gain-bandwidth product of TIAs. Improvements in the gain-bandwidth product are achievable by "nesting" a TIA within another TIA. In other words, additional circuit elements such as feedback resistors, capacitors and/or opamps are added on the input and/or output sides of the TIA. In FIGS. 15–17, capacitive cancellation of the input parasitic capacitance is provided. In FIGS. 20–24, additional feedback resistance is provided. In FIGS. 23 and 24, input and/or feedback capacitance is provided.

Figure 7:
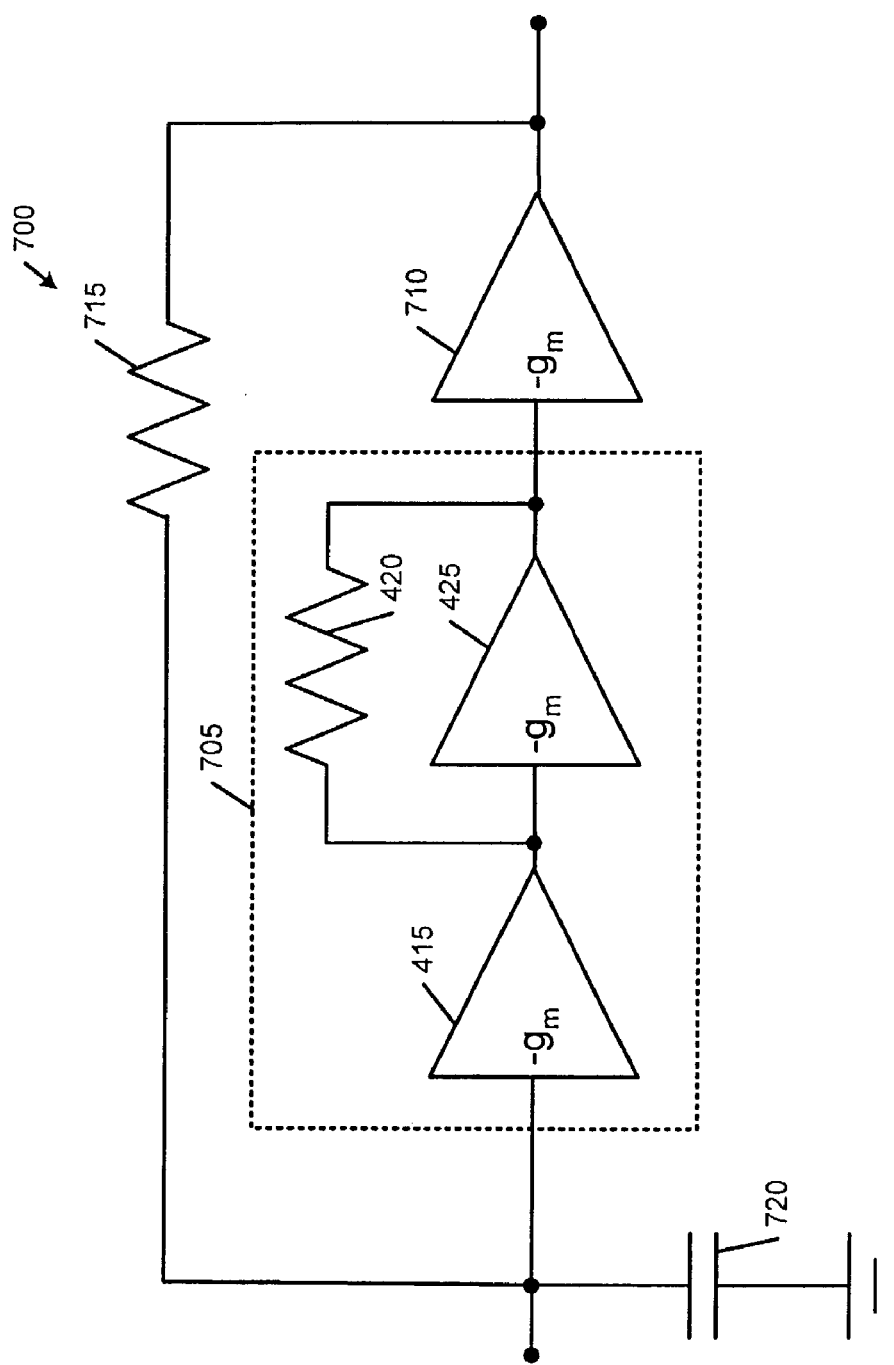
FIG. 7 is a first-order nested TIA according to the present invention.
Figure 8:
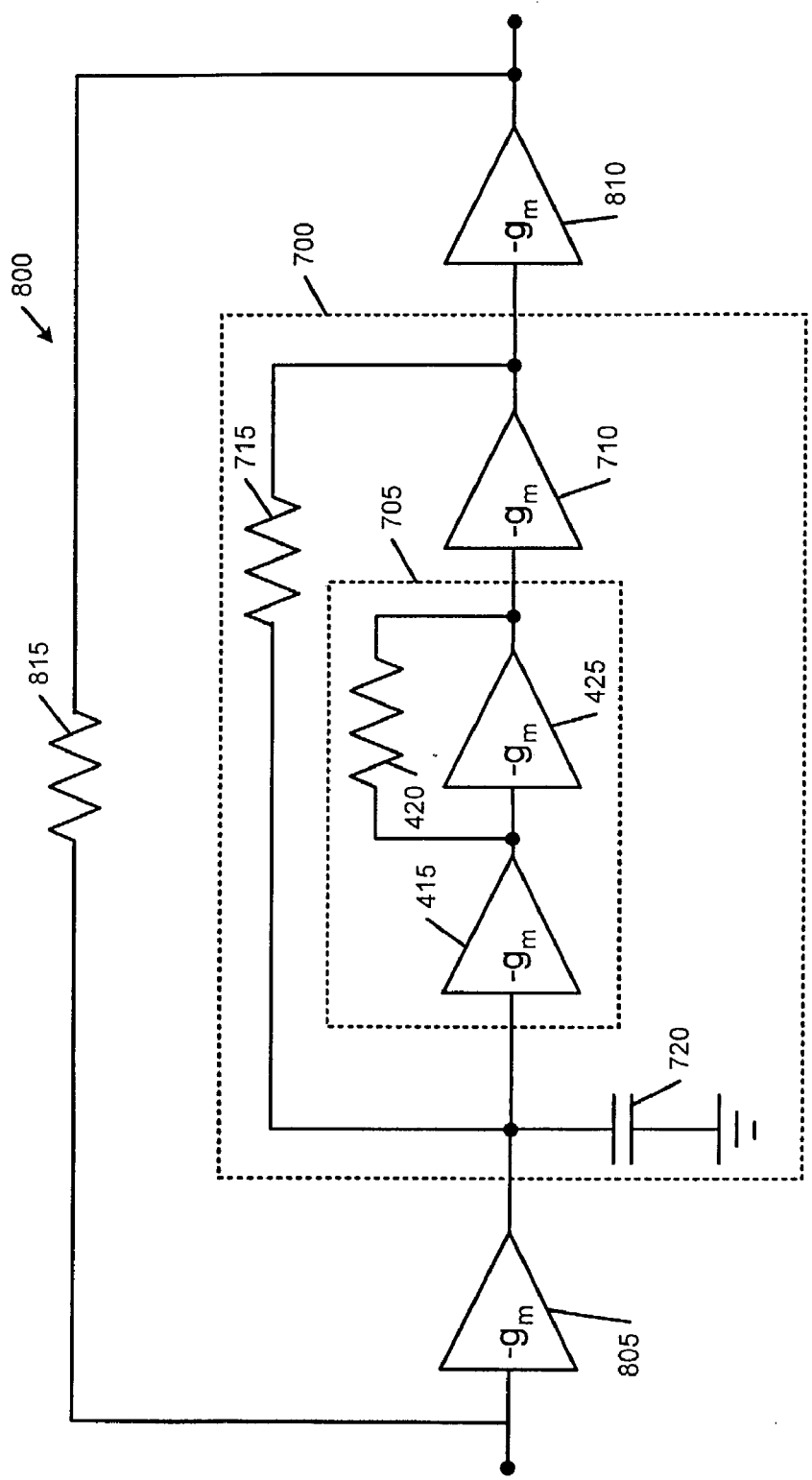
FIG. 8 is a second-order nested TIA according to the present invention.
Figure 9:
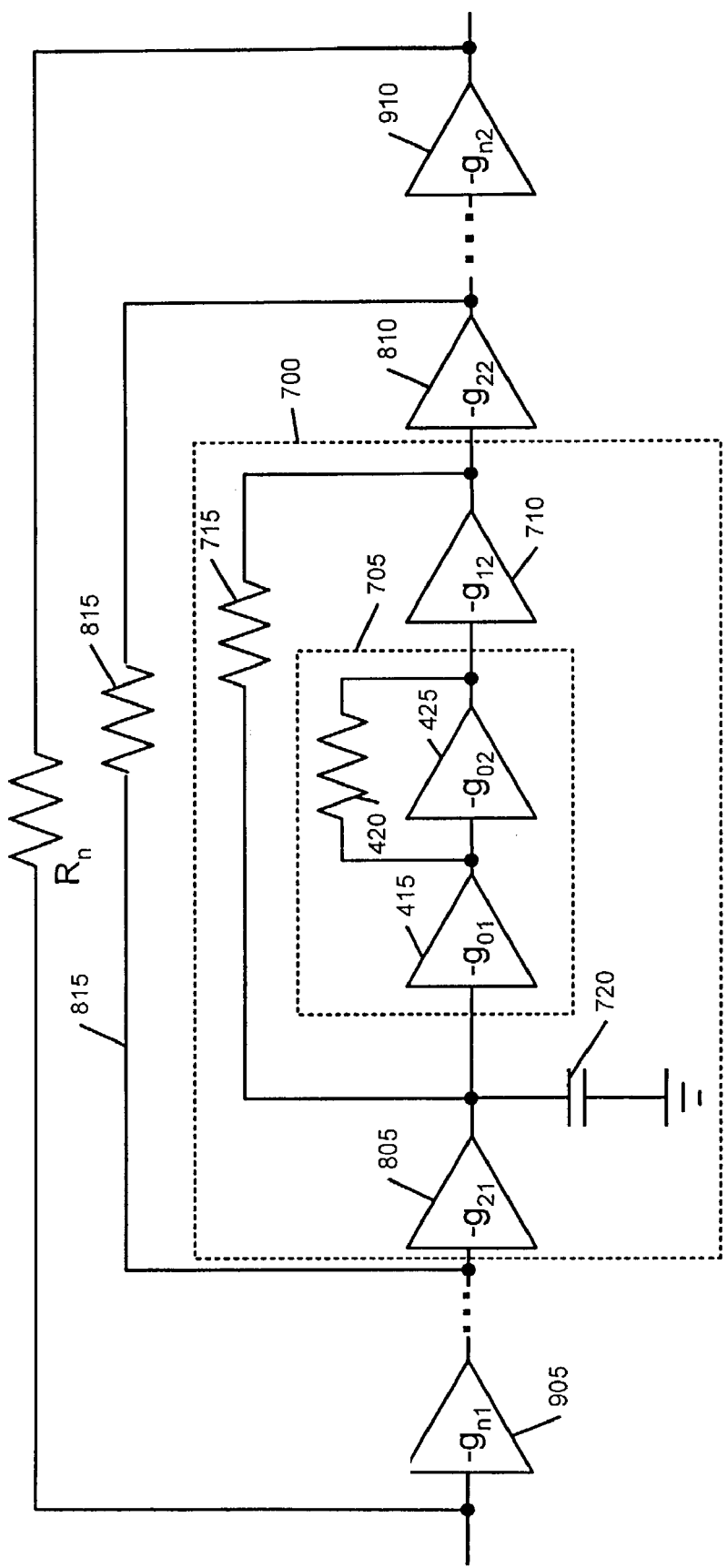
FIG. 9 is an nth-order nested TIA according to the present invention.
Figure 10:
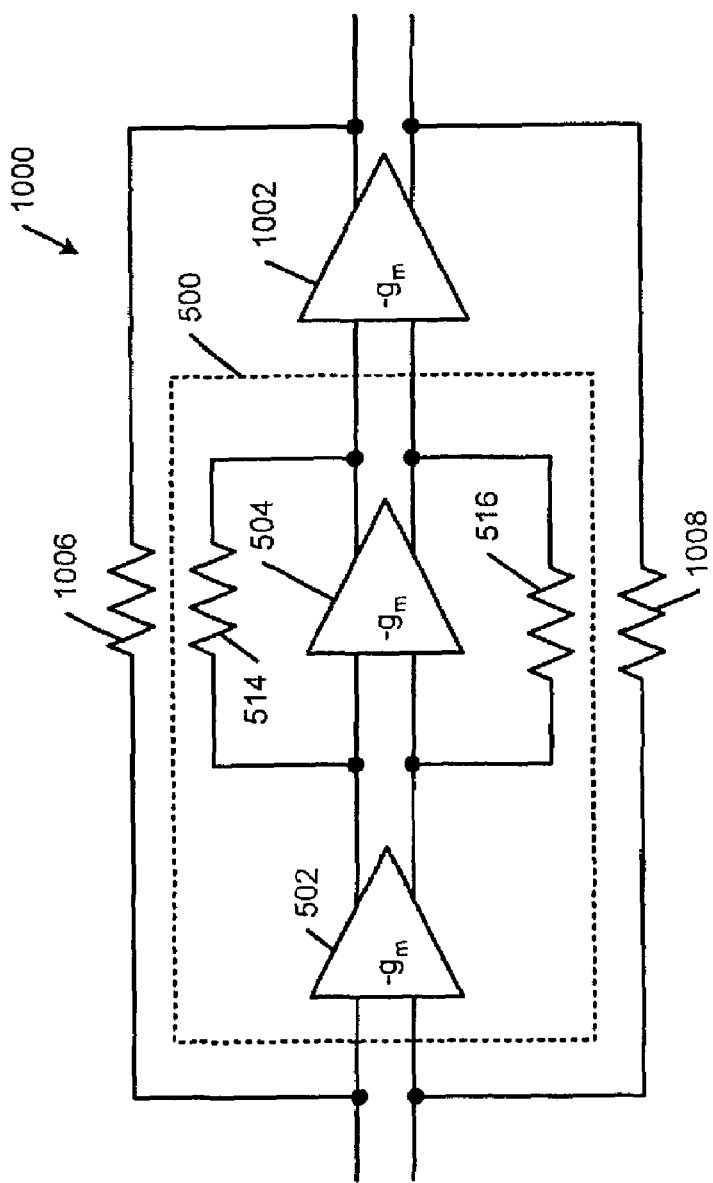
FIG. 10 is a first-order nested TIA in a differential configuration according to the present invention.
Figure 11:
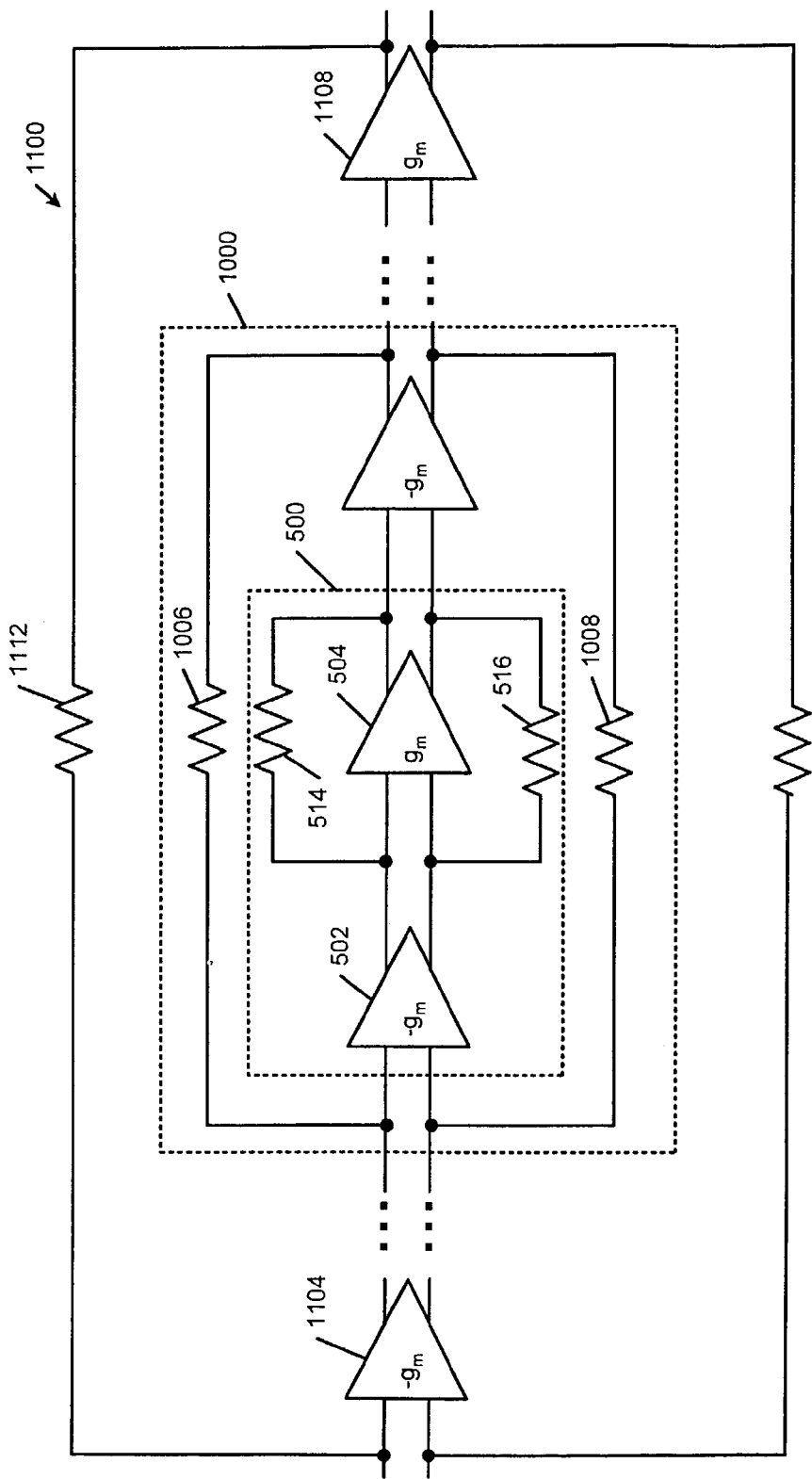
FIG. 11 is an nth-order nested TIA in a differential configuration according to the present invention.

Referring now to FIGS. 7, 8, and 9, a "nested" TIA is constructed by adding opamps, feedback resistors and/or capacitors to a zero-order TIA. In FIGS. 10 and 11, a nested TIA may also be constructed to operate in a differential mode.

Figure 1:
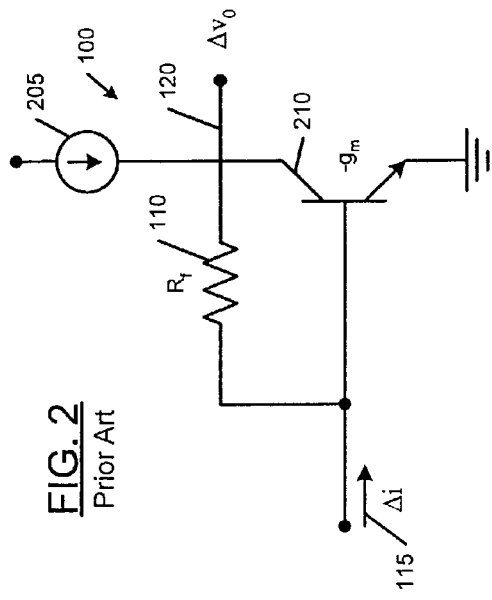
FIGS. 1 and 2 are basic circuit architectures for a current-to-voltage TIA according to the prior art.
Figure 2:
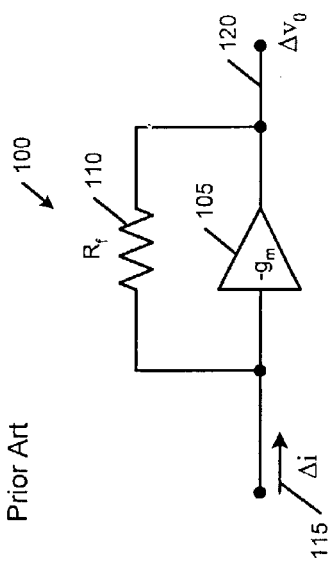
Figure 3:
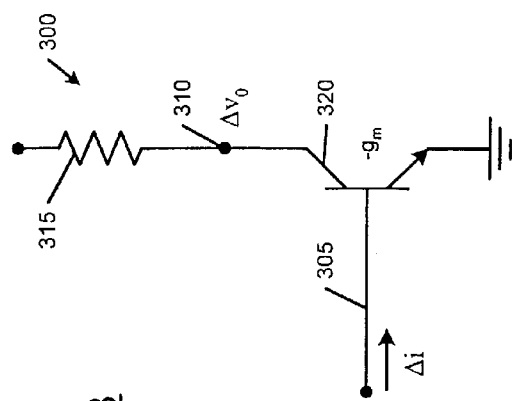
FIGS. 3 and 4 are basic circuit architectures for a voltage-to-voltage TIA according to the prior art.
Figure 4:
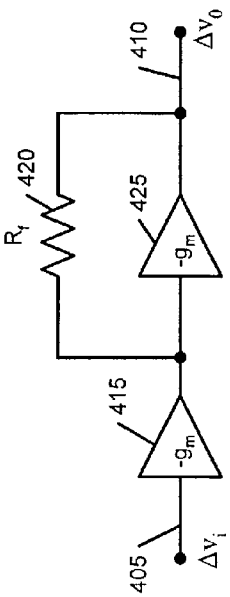
Figure 6:
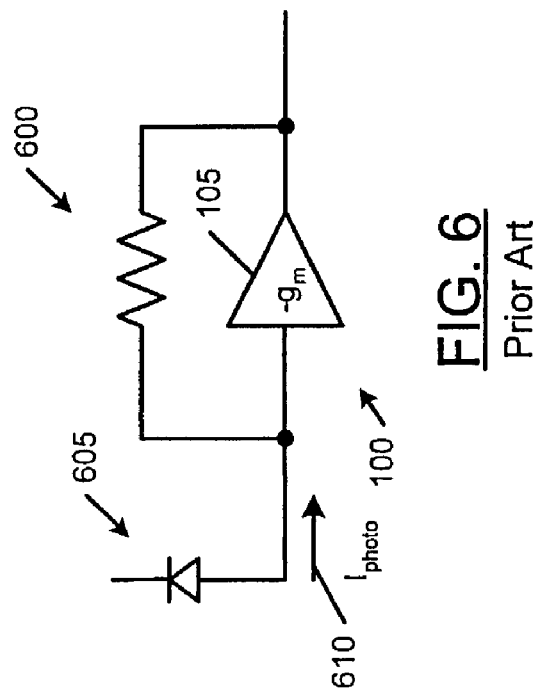
FIG. 6 shows an optical sensor, including a photodiode coupled to a TIA, according to the prior art.

Referring back to FIG. 7, a first-order nested TIA 700 is shown. Reference numbers from FIG. 4 are used in FIG. 7 to identify similar elements. The TIA 700 includes a conventional TIA 705 (also referred to herein as a "zero-order" TIA), an opamp 710, and a feedback resistor 715. The feedback resistor 715 may be a standard fixed-value resistor, a nonlinear variable resistor, or an MOS resistor. A capacitor 720 is also connected between an input of the TIA 700 and ground (or virtual ground).

By nesting the TIA in this manner, improvements in the gain-bandwidth product may be realized. For example, the first-order nested TIA 700 that uses MOS transistors may achieve a bandwidth that is 10%–20% of the threshold frequency $f_T$. This range represents a bandwidth that is approximately five to ten times greater than the bandwidth of the corresponding zero-order TIA.

Figure 12:
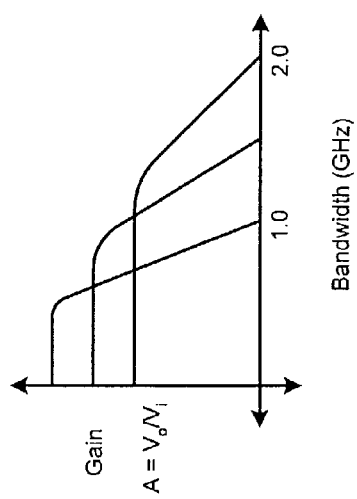
FIG. 12 is a graph of exemplary gain-bandwidth characteristics for a TIA.
Figure 13:
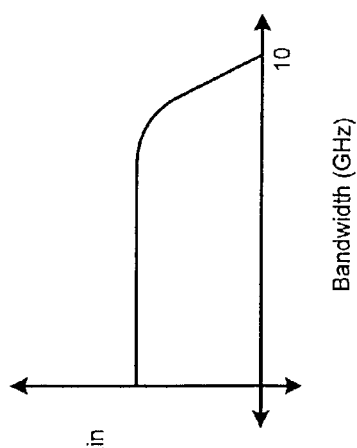
FIG. 13 is a graph of an exemplary gain-bandwidth characteristic for a first-order nested TIA.

Referring now to FIGS. 12 and 13, graphs illustrating characteristic gain-bandwidth curves for a zero-order TIA and a first-order nested TIA, respectively, are shown. In general, a higher value of gain is associated with a lower value of bandwidth, and a lower value of gain is associated with a higher value of bandwidth. The gain A, defined as the output voltage $\Delta v_o$ divided by the input voltage $\Delta v_i$, is typically on the order of a few hundred or a few thousand (i.e., approximately $10^2$–$10^3$). A typical range of threshold frequency ($f_T$) values for a 0.13 µm CMOS process is 30 GHz–40 GHz.

In FIG. 12, three exemplary characteristic curves are shown. A high gain value yields a bandwidth value of approximately 1 GHz. A medium gain value increases the bandwidth to approximately 2 GHz. Other values of gain and bandwidth are possible. For example, a TIA may have a characteristic gain value that is higher than the maximum shown in FIG. 12 and a bandwidth that is less than 1 GHz. A TIA may have a characteristic gain value that is lower than the minimum gain value shown in FIG. 12 and a bandwidth that is greater than 2 GHz. As can be appreciated, the bandwidth varies as an inverse function of gain. This function may be referred to as the "spread". The spread is greater for TIAs using MOS transistors than for TIAs using bipolar junction transistors (BJTs). Thus, the need to improve the TIA bandwidth performance is more pronounced with MOS transistors than with BJT transistors.

The exemplary bandwidth values shown in FIG. 12 do not define upper and lower bandwidth bounds. In many practical applications, bandwidths on the order of 1 GHz or 2 GHz are too low. Many applications, such as an OC192 fiber optic receiver, require bandwidths on the order of 10 GHz. Preamplifiers for high-speed hard disk drives also typically require bandwidths that are on the order of several GHz. Referring now to FIG. 13, a first-order nested TIA at a typical gain value may have a bandwidth of approximately 10 GHz.

Figure 14:
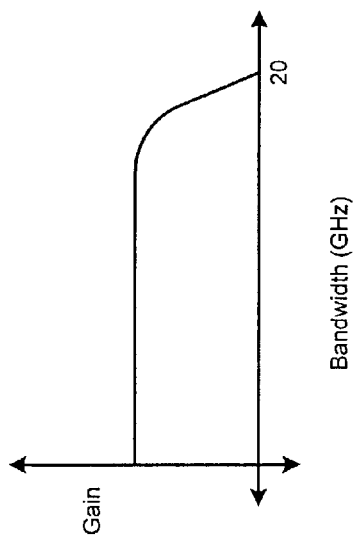
FIG. 14 is a graph of an exemplary gain-bandwidth characteristic for a second-order nested TIA.

Referring now to FIG. 8, a second-order nested TIA 800 builds upon the first-order nested TIA 700. Reference numbers from FIGS. 4 and 7 are used in FIG. 8 to identify similar elements. The second-order nested TIA 800 includes an opamp 805 at the input of the first-order nested TIA 700 and an opamp 810 at the output of the first-order nested TIA 700. An additional feedback resistor 815 is also added across the input of the opamp 805 and the output of the opamp 810. An exemplary gain-bandwidth curve that is produced using the second-order nested TIA 800 is shown in FIG. 14. For a typical gain value, a bandwidth of approximately 20 GHz may be achieved.

Referring now to FIG. 9, higher-order nested TIAs may be constructed by adding additional opamps and feedback resistors. Reference numbers from FIGS. 4, 7 and 8 are used in FIG. 9 to identify similar elements. For example, a third-order nested TIA 900 includes opamps 905 and 910 and feedback resistor 915. It is possible to achieve higher values of either gain or bandwidth (or both) by repeating the technique of the present invention. However, the efficiency of the circuit decreases as additional nesting levels are added due to parasitic noise and increased power dissipation. In general, either the first-order nested TIA or the second-order nested TIA will usually provide sufficient performance.

Figure 5:
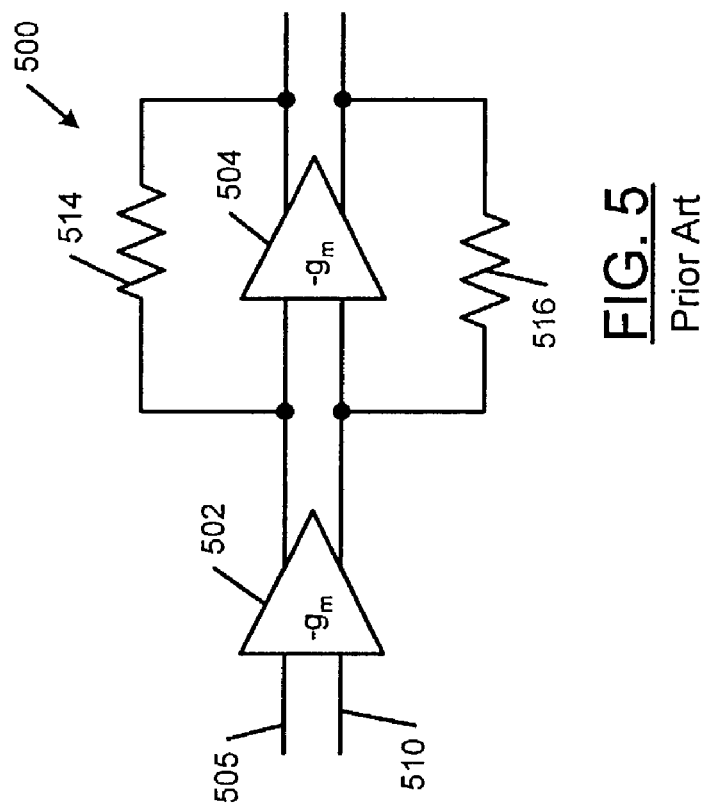
FIG. 5 is a basic circuit architecture for a differential configuration of a TIA according to the prior art.

Referring now to FIG. 10, a differential mode first-order nested TIA 1000 is shown. Reference numbers from FIG. 5 are used in FIG. 10 to identify similar elements. An opamp 1002 is connected to the outputs of the opamp 504. Feedback resistors 1006 and 1008 are connected to inputs of the differential mode TIA 500 and to outputs of the opamp 1002. The gain-bandwidth product of the TIA is increased.

Referring now to FIG. 11, a differential mode nth-order nested TIA 1100 is constructed in a manner that is similar to the nth-order nested TIA of FIG. 9. Reference numbers from FIGS. 5 and 10 are used in FIG. 11 to identify similar elements. Additional opamps 1104 and 1108 and feedback resistors 1112 and 1114 are connected in a similar manner. The gain-bandwidth characteristics for differential mode TIAs are substantially similar to the gain-bandwidth characteristics shown in FIGS. 12–14.

It is noted that the opamps used in the nested TIA may employ either bipolar junction transistors (BJTs), such as gallium-arsenide (GaAs) transistors, or metal-oxide-semiconductor (MOS) transistors, such as CMOS or BICMOS transistors. The preferred embodiments of the invention use MOS transistors due to practical considerations such as ease of manufacture and better power consumption characteristics.

Referring now to FIG. 15, the first order nested TIA 700 is shown with additional feedback capacitance $C_1$, which substantially cancels effects of an input capacitance $C_{P1}$ at the input of the opamp 415. The feedback capacitance $C_1$ has a first end that communicates with an input of the opamp 415 and a second end that communicates with an output of the opamp 425.

Referring now to FIG. 16, the second order nested TIA 800 of FIG. 8 is shown with additional feedback capacitances $C_1$ and $C_2$, which substantially cancel effects of input capacitances $C_{P1}$ and $C_{P2}$ at the inputs of opamps 415 and 805, respectively. The feedback capacitance $C_1$ has a first end that communicates with an input of the opamp 415 and a second end that communicates with an output of the opamp 425. The feedback capacitance $C_2$ has a first end that communicates with an input of the opamp 805 and a second end that communicates with an output of the opamp 710.

Referring now to FIG. 17, the nth order nested TIA of FIG. 9 is shown with additional feedback capacitances $C_1$, $C_2$, ..., and $C_N$, which substantially cancel effects of input capacitances $C_{P1}$, $C_{P2}$, ..., and $CP_N$ at the inputs of opamps 415, 805 and 905, respectively. The feedback capacitance $C_1$ has a first end that communicates with an input of the opamp 415 and a second end that communicates with an output of the opamp 425. The feedback capacitance $C_2$ has a first end that communicates with an input of the opamp 805 and a second end that communicates with an output of the opamp 710. The feedback capacitance $C_N$ has a first end that communicates with an input of the opamp 905 and a second end that communicates with an output of the opamp 810.

Figure 18:
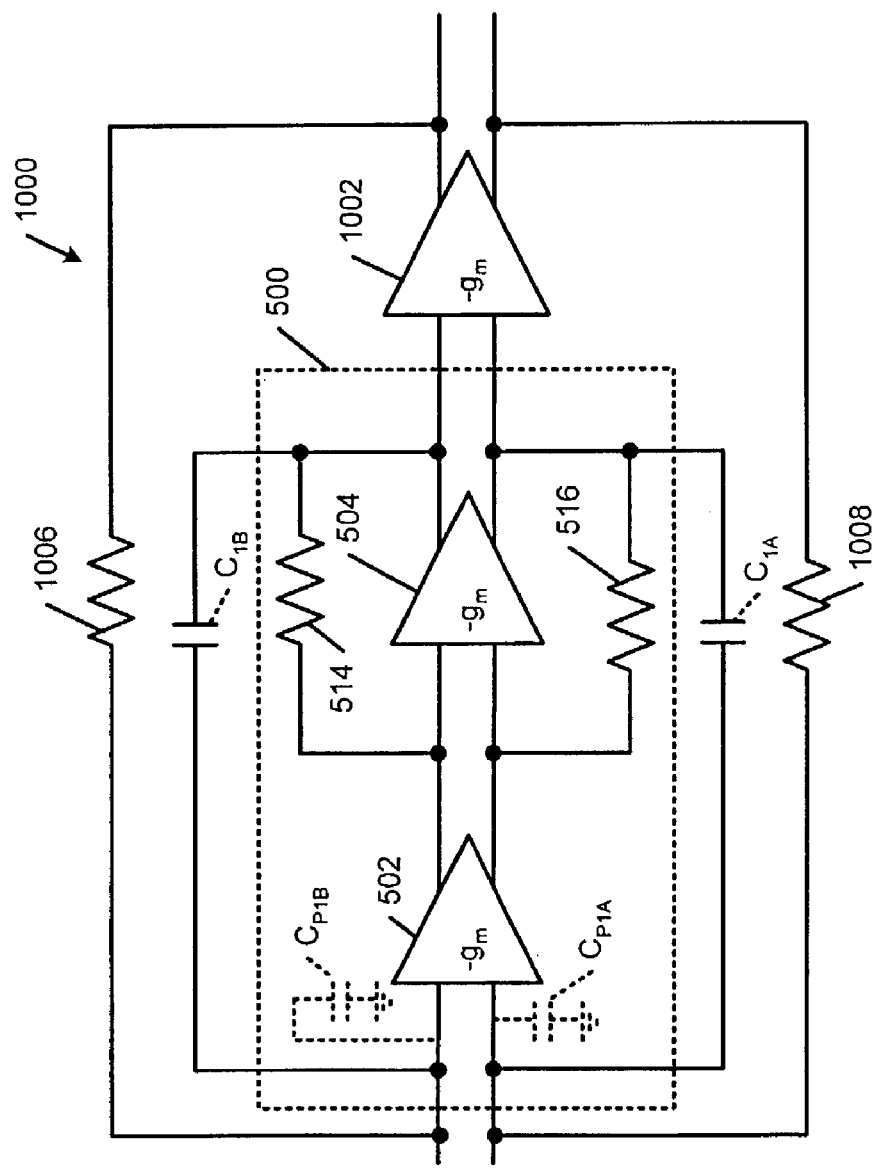
FIG. 18 is a first-order nested TIA in a differential configuration with capacitive cancellation of input parasitic capacitance according to the present invention.
Figure 19:
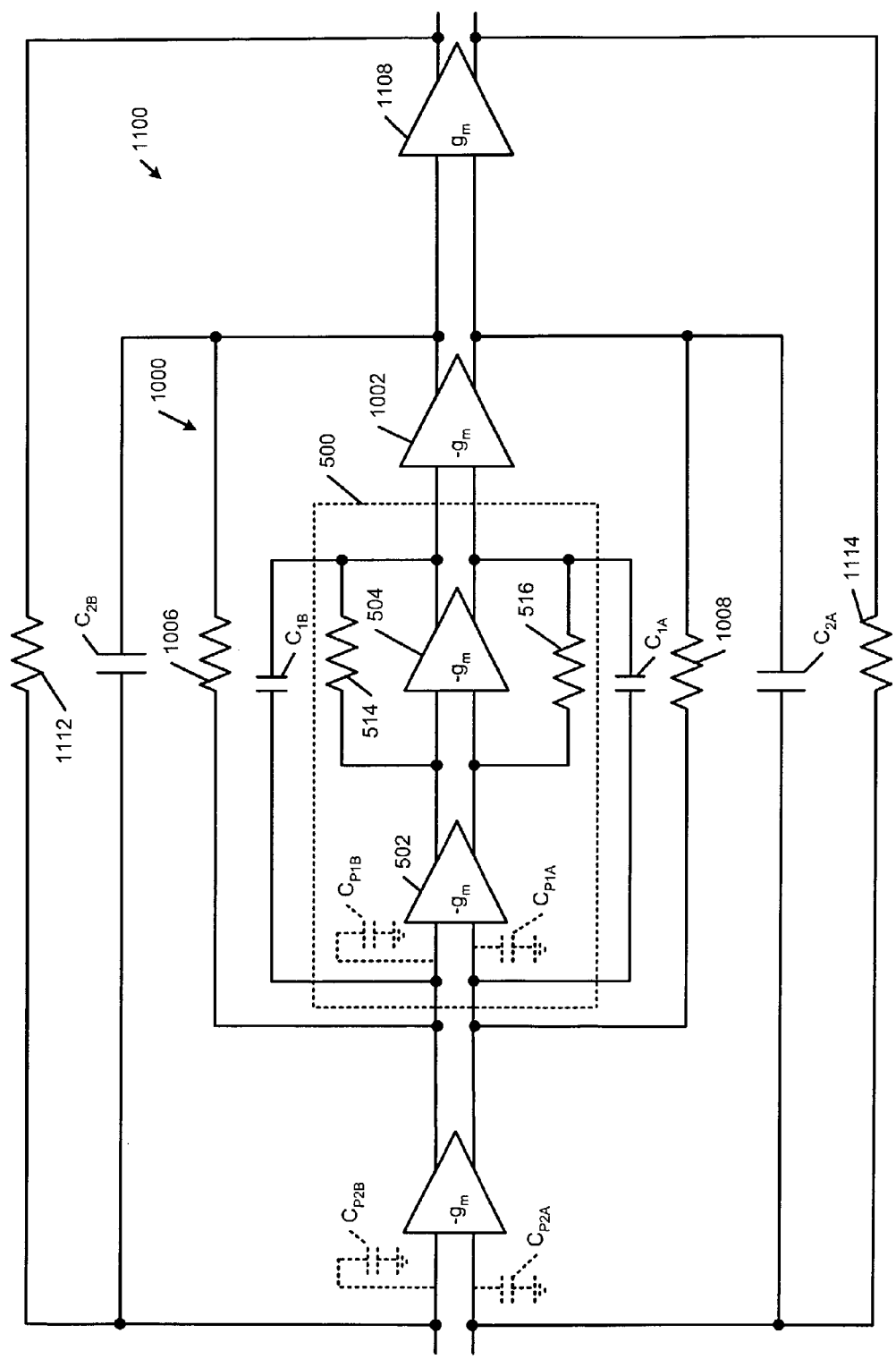
FIG. 19 is a second order nested TIA in a differential configuration with capacitive cancellation of input parasitic capacitance according to the present invention.
Figure 20:
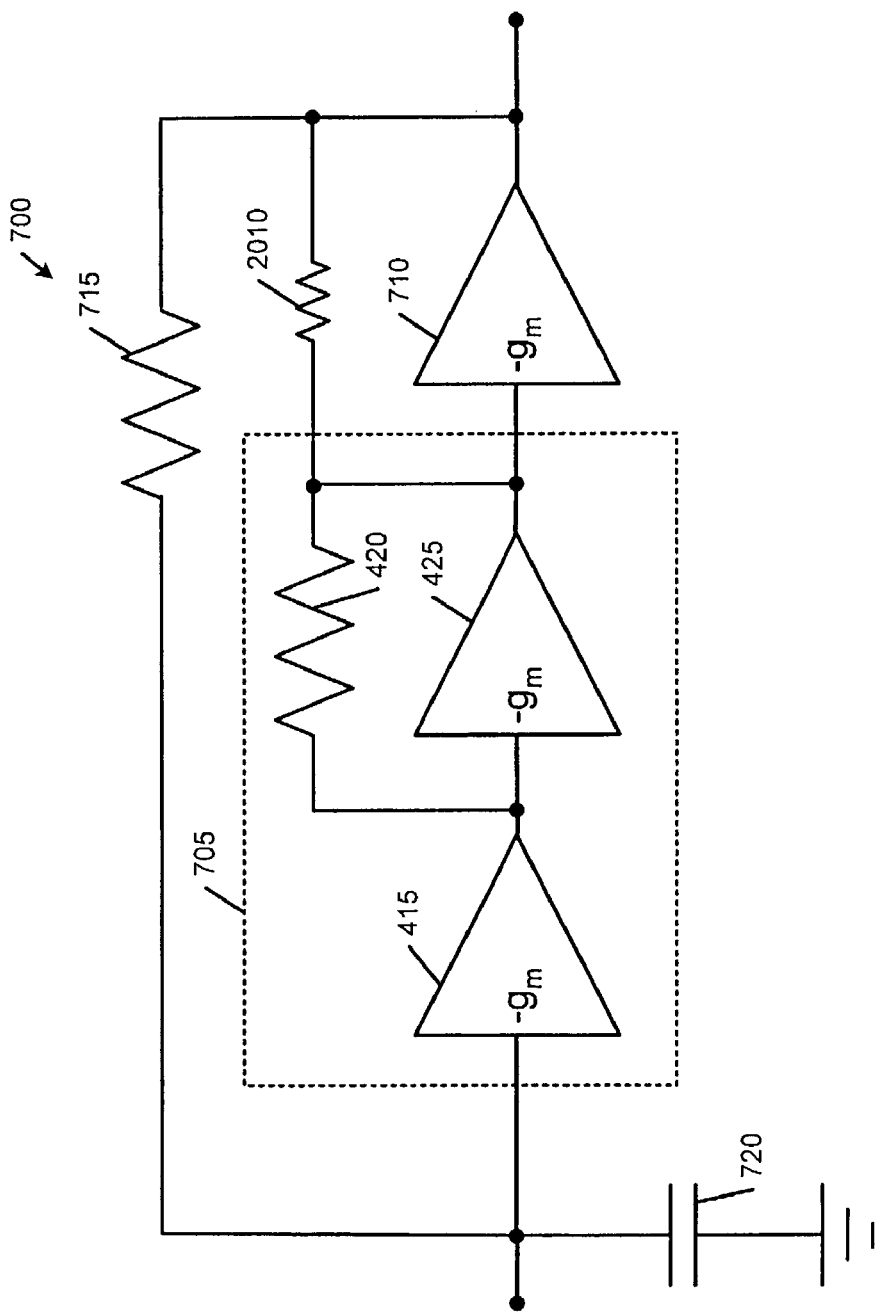
FIG. 20 illustrates the first order nested TIA of FIG. 7 with additional feedback resistance.

Referring now to FIG. 18, the first order nested differential mode TIA 1000 is shown with additional feedback capacitors $C_{1A}$ and $C_{1B}$, which substantially cancel effects of input parasitic capacitances $C_{P1}$ and $C_{P2}$ at the inputs of the differential mode opamp 502. The feedback capacitance $C_{1A}$ has a first end that communicates with an input of the differential mode opamp 502 and a second end that communicates with an output of the differential mode opamp 504. In FIG. 19, additional capacitances $C_{2A}$ and $C_{2B}$ are added to a second order differential mode TIAs in a similar manner to offset parasitic capacitances $C_{P2A}$ and $C_{P2B}$. Higher order circuits use a similar approach.

Referring back to FIG. 20, the first order nested TIA of FIG. 7 is shown with additional feedback resistance 2010. The feedback resistance 2010 has a first end that communicates with an input of the opamp 710. A second end of the resistance 2010 communicates with an output of the opamp 710.

Figure 21:
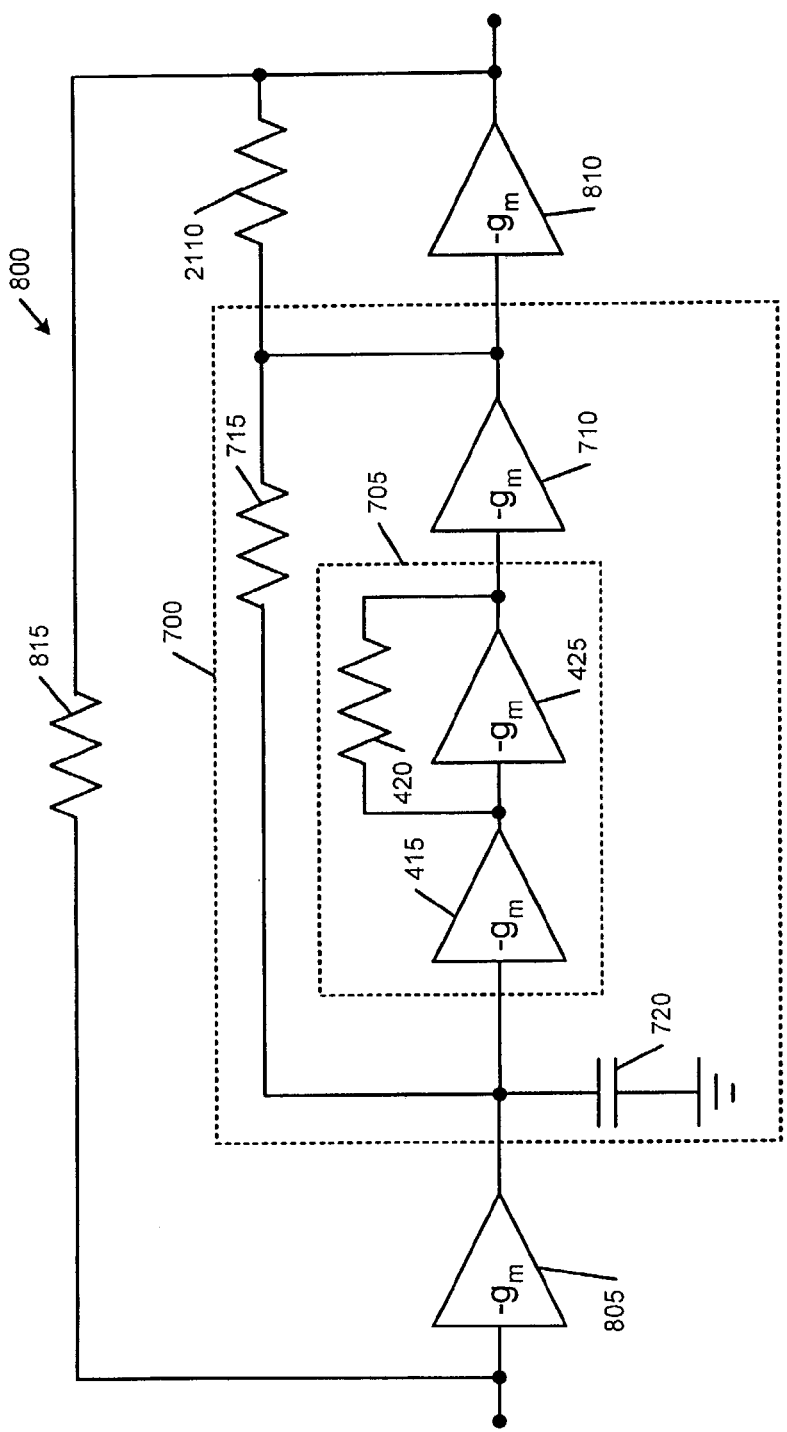
FIG. 21 illustrates a second order nested TIA of FIG. 8 with additional feedback resistance.

Referring now to FIG. 21, the second order nested TIA of FIG. 8 is shown with additional feedback resistance 2110. The feedback resistance 2110 has a first end that communicates with an input of the opamp 810. A second end of the resistance 2110 communicates with an output of the opamp 810.

Figure 22:
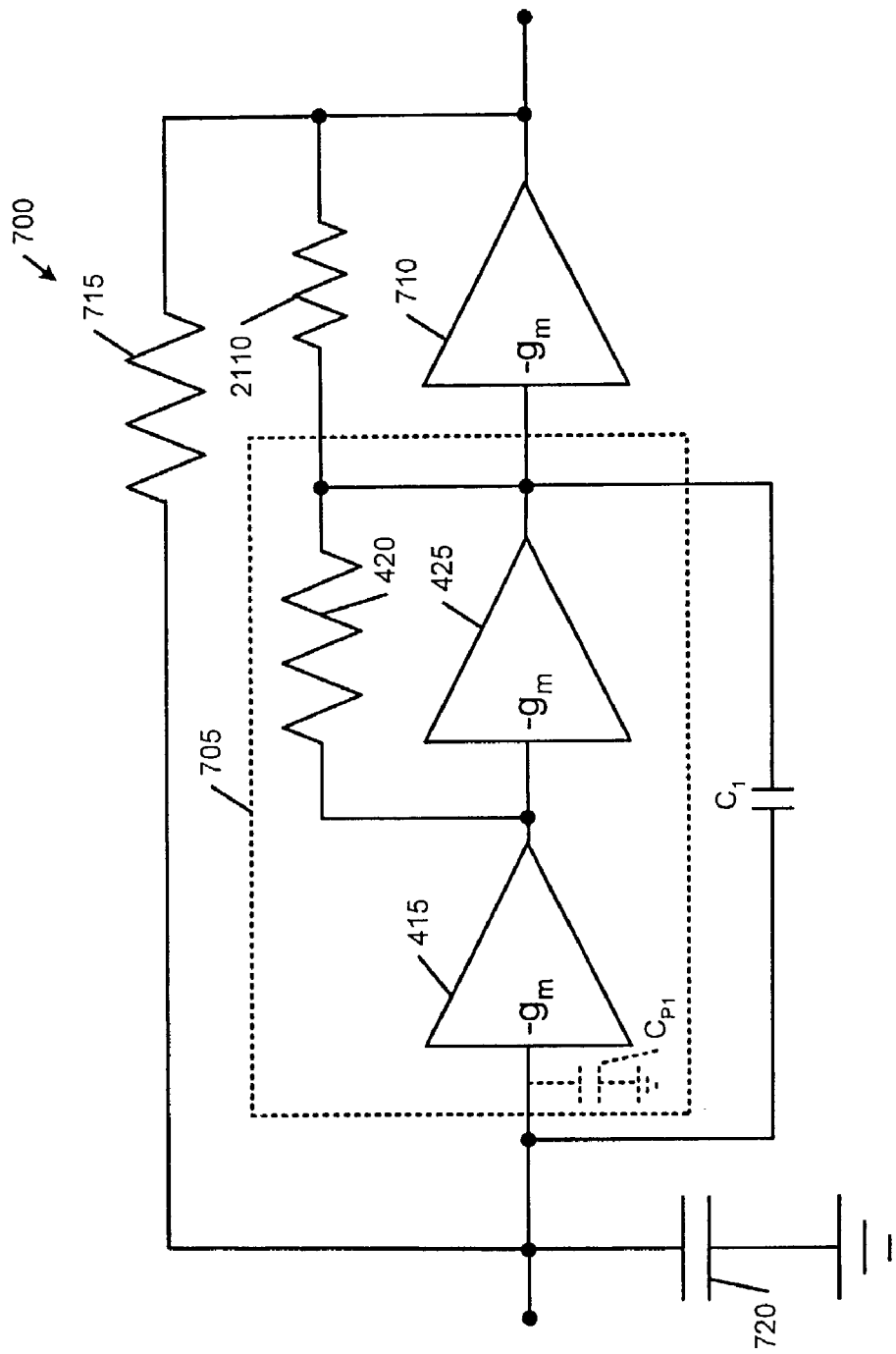
FIG. 22 illustrates the first order nested TIA of FIG. 15 with additional feedback resistance.

Referring now to FIG. 22, the first order nested TIA of FIG. 15 is shown with additional feedback resistance 2210. The feedback resistance 2210 has a first end that communicates with an input of the opamp 710. A second end of the resistance 2210 communicates with an output of the opamp 710.

Referring now to FIG. 23, the first order nested TIA of FIG. 7 is shown with input capacitance $C_{IN}$, feedback capacitance $C_{FB}$, and feedback resistance 2310. The input capacitance $C_{IN}$ has a first end that receives an input signal for the nested TIA 700 and a second end that communicates with an input of opamp 415. The feedback capacitance $C_{FB}$ has a first end that communicates with an input of opamp 415 and a second end that communicates with one end of resistance 715.

The additional feedback resistances, input capacitances, and/or feedback capacitances can also be added to the differential mode nested TIA. Referring now to FIG. 24, the first order differential mode nested TIA of FIG. 10 is shown with first and second input capacitances $C_{IN1}$ and $C_{IN2}$, first and second feedback capacitances $C_{FB1}$ and $C_{FB2}$, and feedback resistances 2410 and 2412. The input capacitances $C_{IN1}$ and $C_{IN2}$ have first ends that receive input signals for the nested differential mode TIA and second ends that communicate with inputs of opamp 502. The feedback capacitances $C_{FB1}$ and $C_{FB2}$ have first ends that communicate with inputs of opamp 502 and second ends that communicate with first ends of resistances 1006 and 1008, respectively. First and second feedback resistances 2410 and 2412 have first ends that are connected to inputs and second ends that are connected to outputs of differential mode opamp 1002.

As can be appreciated, the feedback capacitances (FIGS. 15–19), feedback resistances (FIGS. 20–24), and input and feedback capacitances (FIGS. 23 and 24) can be used in any combination on first, second, . . . or $n^{th}$ order nested TIA and/or differential mode TIA.

Figure 25:
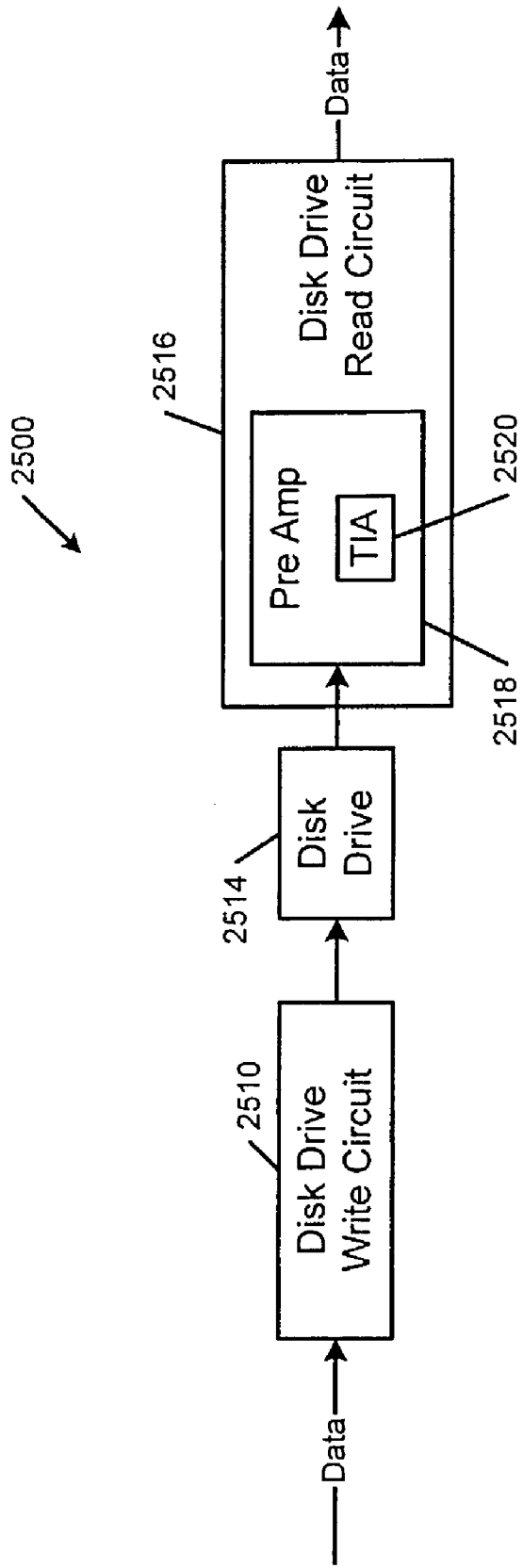
FIG. 25 illustrates an exemplary disk drive system including a preamplifier with a nested TIA according to the present invention.

Referring now to FIG. 25, an exemplary disk drive system 2500 is shown to include a disk drive write circuit 2510 that writes to a disk drive 2514. A disk drive read circuit 2516 includes a preamp circuit 2518 with a nested TIA or nested differential mode TIA identified at 2520, which is implemented as described above.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A nested transimpedance amplifier (TIA) circuit, comprising:
    a zero-order TIA having an input and an output;
    a first operational amplifier (opamp) having an input that communicates with said output of said zero-order TIA and an output;
    a first feedback resistance having one end that communicates with said input of said zero-order TIA and an opposite end that communicates with said output of said first opamp;
    a first feedback capacitance having a first end that communicates with said input of said zero-order TIA and a second end that communicates with said output of said zero-order TIA; and
    a capacitor having one end that communicates with said input of said zero-order TIA.

2. A nested transimpedance amplifier (TIA) circuit, comprising:
    a zero-order TIA having an input and an output;
    a first operational amplifier (opamp) having an input that communicates with said output of said zero-order TIA and an output;
    a first feedback resistance having one end that communicates with said input of said zero-order TIA and an opposite end that communicates with said output of said first opamp;
    a first feedback capacitance having a first end that communicates with said input of said zero-order TIA and a second end that communicates with said output of said zero-order TIA; and
    a capacitor having one end that communicates with said input of said zero-order TIA,
    wherein said zero order TIA includes a second opamp having an input and an output and a third opamp having an input that communicates with said output of said second opamp and an output.

3. The nested TIA circuit of claim 2, wherein said zero order TIA includes a second feedback resistance having one end that communicates with said input of said third opamp and an opposite end that communicates with said output of said third opamp.

4. The nested TIA circuit of claim 3 further comprising a fourth opamp having an input and an output that communicates with said input of said second opamp.

5. The nested TIA circuit of claim 4 further comprising a fifth opamp having an input that communicates with said output of said first opamp and an output.

6. The nested TIA circuit of claim 5 further comprising a second feedback capacitance having a first end that communicates with said input of said fourth opamp and a second end that communicates with said output of said first opamp.

7. The nested TIA circuit of claim 5 further comprising a third feedback resistance having one end that communicates with said input of said fourth opamp and an opposite end that communicates with said output of said fifth opamp.

8. A nested transimpedance amplifier (TIA) circuit, comprising:
    a zero-order TIA having an input and an output;
    a first operational amplifier (opamp) having an input that communicates with said output of said zero-order TIA and an output;
    a first feedback resistance having one end that communicates with said input of said zero-order TIA and an opposite end that communicates with said output of said first opamp;
    a first feedback capacitance having a first end that communicates with said input of said zero-order TIA and a second end that communicates with said output of said zero-order TIA; and
    at least one higher order circuit that is connected to said nested TIA circuit and includes an $n^{th}$ feedback resistance, an $n^{th}$ opamp, an $(n+1)^{th}$ opamp, and an $n^{th}$ feedback capacitance.

9. The nested TIA circuit of claim 2 wherein said first feedback resistance is one of a standard fixed-value resistor, a nonlinear variable resistor and a metal-oxide-semiconductor (MOS) resistor.

10. The nested TIA circuit of claim 2 wherein said first opamp includes one of bipolar junction transistors and metal-oxide-semiconductor transistors.

11. A nested transimpedance amplifier (TIA) circuit, comprising:
a zero-order TIA having an input and an output;
a first operational amplifier (opamp) having an input that communicates with said output of said zero-order TIA and an output;
a first feedback resistance having one end that communicates with said input of said zero-order TIA and an opposite end that communicates with said output of said first opamp;
a first feedback capacitance having a first end that communicates with said input of said zero-order TIA and a second end that communicates with said output of said zero-order TIA; and
a capacitor having one end that communicates with said input of said zero-order TIA,
wherein said first opamp includes metal-oxide-semiconductor transistors and a bandwidth of said nested TIA circuit is greater than 10% of a threshold frequency.

12. The nested TIA circuit of claim 2 wherein said nested TIA circuit is implemented in an optical sensor.

13. The nested TIA circuit of claim 2 wherein said nested TIA circuit is implemented in a preamplifier of a hard disk drive.

14. The nested TIA circuit of claim 2 further comprising an input capacitance having a first end that communicates with an input of said zero-order TIA and a second end that receives an input signal to said nested TIA.

15. A nested transimpedance amplifier (TIA) circuit, comprising:
a zero-order TIA having an input and an output;
a first operational amplifier (opamp) having an input that communicates with said output of said zero-order TIA and an output;
a first feedback resistance having one end that communicates with said input of said zero-order TIA and an opposite end that communicates with said output of said first opamp;
a first feedback capacitance having a first end that communicates with said input of said zero-order TIA and a second end that communicates with said output of said zero-order TIA; and
a second feedback capacitance that is connected between said first feedback resistance and said input of said zero-order TIA.

16. A nested transimpedance amplifier (TIA) circuit, comprising:
a zero-order TIA having an input and an output;
a first operational amplifier (opamp) having an input that communicates with said output of said zero-order TIA and an output;
a first feedback resistance having one end that communicates with said input of said zero-order TIA and an opposite end that communicates with said output of said first opamp;
a first feedback capacitance having a first end that communicates with said input of said zero-order TIA and a second end that communicates with said output of said zero-order TIA; and
a second feedback resistance having a first end that communicates with said input of said first opamp and an opposite end that communicates with said output of said first op-amp.

17. The nested TIA circuit of claim 5 further comprising a fourth feedback resistance having a first end that communicates with said input of said fifth opamp and an opposite end that communicates with said output of said fifth op-amp.

18. A nested differential mode TIA circuit, comprising:
a zero-order differential mode TIA having first and second inputs and first and second outputs;
a first differential mode opamp having first and second inputs that communicate with said first and second outputs of said zero-order differential mode TIA and first and second outputs;
a first feedback resistance having one end that communicates with said first input of said zero-order differential mode TIA and an opposite end that communicates with said first output of said first differential mode opamp;
a second feedback resistance having one end that communicates with said second input of said zero-order differential mode TIA and an opposite end that communicates with said second output of said first differential mode opamp;
a first capacitance having a first end that communicates with said first input of said zero-order differential mode TIA and a second end that communicates with said first output of said zero-order differential mode TIA; and
a second capacitance having a first end that communicates with said second input of said zero-order differential mode TIA and a second end that communicates with said second output of said zero-order differential mode TIA.

19. The nested differential mode TIA circuit of claim 18 wherein said zero order differential mode TIA includes a second differential mode opamp having first and second inputs and first and second outputs.

20. The nested differential mode TIA circuit of claim 19 wherein said zero order TIA includes a third differential mode opamp having first and second inputs that communicates with said first and second outputs of said second differential mode opamp and first and second outputs.

21. The nested differential mode TIA circuit of claim 20 wherein said zero order TIA includes a third feedback resistance having one end that communicates with said first input of said third differential mode opamp and an opposite end that communicates with said first output of said third differential mode opamp.

22. The nested differential mode TIA circuit of claim 21 wherein said zero order TIA includes a fourth feedback resistance having one end that communicates with said second input of said third differential mode opamp and an opposite end that communicates with said second output of said third differential mode opamp.

23. The nested differential mode TIA circuit of claim 18 further comprising at least one higher order circuit that is connected to said nested differential mode TIA circuit and includes an $n^{th}$ feedback resistance, an $(n+1)^{th}$ feedback resistance, an $n^{th}$ differential mode opamp, and $n^{th}$ and $(N+1)^{th}$ feedback capacitances.

24. The nested differential mode TIA circuit of claim 18 wherein said first feedback resistance is one of a standard fixed-value resistor, a nonlinear variable resistor and a metal-oxide-semiconductor (MOS) resistor.

25. The nested differential mode TIA circuit of claim 18 wherein said nested differential mode TIA circuit is implemented in one of an optical sensor and a preamplifier of a hard disk drive.

26. The nested differential mode TIA circuit of claim 18 further comprising first and second input capacitances having first ends that communicate with said first and second inputs of said zero-order differential mode TIA, respectively, and second ends that receive first and second differential input signals for said nested differential mode TIA, respectively.

27. The nested differential mode TIA circuit of claim 18 further comprising second and third feedback capacitances that are connected between said first and second feedback resistances and said first and second inputs of said zero-order differential mode TIA, respectively.

28. The nested differential mode TIA circuit of claim 18 further comprising third and fourth feedback resistances having first ends that communicate with said first and second inputs of said first differential mode opamp and opposite ends that communicates with said first and second outputs of said first differential mode op amp, respectively.

29. A nested transimpedance amplifier (TIA) circuit, comprising:
   a zero-order TIA having an input and an output;
   a first operational amplifier (opamp) having an input that communicates with said output of said zero-order TIA and an output;
   a first feedback capacitance having one end that communicates with said input of said zero-order TIA;
   a first feedback resistance having one end that communicates with an opposite end of said first feedback capacitance and an opposite end that communicates with said output of said first opamp; and
   a second feedback capacitance that has one end that communicates with said input of said zero-order TIA and an opposite end that communicates with said output of said zero-order TIA.

30. The nested TIA circuit of claim 29 further comprising a capacitor having one end that communicates with said input of said zero-order TIA.

31. The nested transimpedance amplifier (TIA) circuit of claim 29 further comprising a second feedback resistance having a first end that communicates with said input of said first opamp and an opposite and that communicates with said output of said first op-amp.

32. A nested transimpedance amplifier (TIA) circuit, comprising:
   a zero-order TIA having an input and an output;
   a first operational amplifier (opamp) having an input that communicates with said output of said zero-order TIA and an output;
   a first feedback capacitance having one end that communicates with said input of said zero-order TIA; and
   a first feedback resistance having one end that communicates with an opposite end of said first feedback capacitance and an opposite end that communicates with said output of said first opamp,
   wherein said zero order TIA includes a second opamp having an input and an output and a third opamp having an input that communicates with said output of said second opamp and an output.

33. The nested TIA circuit of claim 32 wherein said zero order TIA includes a second feedback resistance having one end that communicates with said input of said third opamp and an opposite end that communicates with said output of said third opamp.

34. The nested TIA circuit of claim 33 further comprising a fourth opamp having an input and an output that communicates with said input of said second opamp.

35. The nested TIA circuit of claim 34 further comprising a fifth opamp having an input that communicates with said output of said first opamp and an output.

36. The nested TIA circuit of claim 35 further comprising a second feedback capacitance having a first end that communicates with said input of said fourth opamp and a second end that communicates with said output of said first opamp.

37. The nested TIA circuit of claim 35 further comprising a third feedback resistance having one end that communicates with said input of said fourth opamp and an opposite end that communicates with said output of said fifth opamp.

38. A nested transimpedance amplifier (TIA) circuit, comprising:
   a zero-order TIA having an input and an output;
   a first operational amplifier (opamp) having an input that communicates with said output of said zero-order TIA and an output;
   a first feedback capacitance having one end that communicates with said input of said zero-order TIA;
   a first feedback resistance having one end that communicates with an opposite end of said first feedback capacitance and an opposite end that communicates with said output of said first opamp; and
   at least one higher order circuit that is connected to said nested TIA circuit and includes an $n^{th}$ feedback resistance, an $n^{th}$ opamp, an $(n+1)^{th}$ opamp, and an $n^{th}$ feedback capacitance.

39. The nested TIA circuit of claim 29 wherein said first feedback resistance is one of a standard fixed-value resistor, a nonlinear variable resistor and a metal-oxide-semiconductor (MOS) resistor.

40. The nested TIA circuit of claim 29 wherein said first opamp includes one of bipolar junction transistors and metal-oxide-semiconductor transistors.

41. A nested transimpedance amplifier (TIA) circuit, comprising:
   a zero-order TIA having an input and an output;
   a first operational amplifier (opamp) having an input that communicates with said output of said zero-order TIA and an output;
   a first feedback capacitance having one end that communicates with said input of said zero-order TIA; and
   a first feedback resistance having one end that communicates with an opposite end of said first feedback capacitance and an opposite end that communicates with said output of said first opamp,
   wherein said first opamp includes metal-oxide-semiconductor transistors and a bandwidth of said nested TIA circuit is greater than 10% of a threshold frequency.

42. The nested TIA circuit of claim 29 wherein said nested TIA circuit is implemented in an optical sensor.

43. The nested TIA circuit of claim 29 wherein said nested TIA circuit is implemented in a preamplifier of a hard disk drive.

44. The nested TIA circuit of claim 29 further comprising an input capacitance having a first end that communicates with an input of said zero-order TIA and a second end that receives an input signal to said nested TIA.

45. The nested TIA circuit of claim 35 further comprising a third feedback resistance having a first end that communicates with said output of said fifth opamp and an opposite end that communicates with said input of said fifth op-amp.

46. A nested differential mode TIA circuit, comprising:
   a zero-order differential mode TIA having first and second inputs and first and second outputs;
   a first differential mode opamp having first and second inputs that communicate with said first and second outputs of said zero-order differential mode TIA and first and second outputs;
   a first feedback capacitance having one end that communicates with said first input of said zero-order differential mode TIA;

a first feedback resistance having one end that communicates with an opposite end of said first feedback capacitance and an opposite end that communicates with said first output of said first differential mode opamp;

a second feedback capacitance having one end that communicates with said second input of said zero-order differential mode TIA; and a second feedback resistance having one end that communicates with an opposite end of said second feedback capacitance and an opposite end that communicates with said second output of said first differential mode opamp.

47. The nested differential mode TIA circuit of claim 46 further comprising:

a third feedback resistance having a first end that communicates with said first input of said first differential mode opamp and an opposite end that communicates with said first output of said first differential mode op-amp; and a fourth feedback resistance having a first end that communicates with said second input of said first differential mode opamp and an opposite end that communicates with said second output of said first differential mode op-amp.

48. The nested differential mode TIA circuit of claim 47 further comprising:

a third feedback capacitance having a first end that communicates with said first input of said zero-order differential mode TIA and a second end that communicates with said first output of said zero-order differential mode TIA; and a fourth feedback capacitance having a first end that communicates with said second input of said zero-order differential mode TIA and a second end that communicates with said second output of said zero-order differential mode TIA.

49. The nested differential mode TIA circuit of claim 46 wherein said zero order differential mode TIA includes a second differential mode opamp having first and second inputs and first and second outputs.

50. The nested differential mode TIA circuit of claim 49 wherein said zero order TIA includes a third differential mode opamp having first and second inputs that communicates with said first and second outputs of said second differential mode opamp and first and second outputs.

51. The nested differential mode TIA circuit of claim 50 wherein said zero order TIA includes a third feedback resistance having one end that communicates with said first input of said third differential mode opamp and an opposite end that communicates with said first output of said third differential mode opamp.

52. The nested differential mode TIA circuit of claim 51 wherein said zero order TIA includes a fourth feedback resistance having one end that communicates with said second input of said third differential mode opamp and an opposite end that communicates with said second output of said third differential mode opamp.

53. The nested differential mode TIA circuit of claim 46 further comprising at least one higher order circuit that is connected to said nested differential mode TIA circuit and includes an $n^{th}$ feedback resistance, an $(n+1)^{th}$ feedback resistance, an $n^{th}$ differential mode opamp, and $n^{th}$ and $(N+1)^{th}$ feedback capacitances.

54. The nested differential mode TIA circuit of claim 46 wherein said first feedback resistance is one of a standard fixed-value resistor, a nonlinear variable resistor and a metal-oxide-semiconductor (MOS) resistor.

55. The nested differential mode TIA circuit of claim 46 wherein said nested differential mode TIA circuit is implemented in one of an optical sensor and a preamplifier of a hard disk drive.

56. The nested differential mode TIA circuit of claim 46 further comprising first and second input capacitances having first ends that communicate with said first and second inputs of said zero-order differential mode TIA and second ends that receive first and second differential input signals for said nested differential mode TIA, respectively.

57. A differential mode amplifier circuit, comprising:

a first differential mode operational amplifier (opamp) having first and second inputs and first and second outputs;

a first feedback resistance having a first end that communicates with said first input of said first differential mode opamp and a second end that communicates with said first output of said first differential mode opamp;

a second feedback resistance having a first end that communicates with said second input of said first differential mode opamp and a second end that communicates with said second output of said first differential mode opamp;

a second differential mode operational amplifier (opamp) having first and second inputs that communicate with said first and second outputs of said first differential mode opamp and first and second outputs;

a third feedback resistance having a first end that communicates with said first input of said second differential mode opamp and a second end that communicates with said first output of said second differential mode opamp;

a fourth feedback resistance having a first end that communicates with said second input of said second differential mode opamp and a second end that communicates with said second output of said second differential mode opamp;

a third opamp having first and second outputs that communicate with said first and second inputs of said first differential mode opamp and first and second inputs;

a fifth feedback resistance having a first end that communicates with said first input of said third differential mode opamp and a second end that communicates with said first output of said second differential mode opamp; and a sixth feedback resistance having a first end that communicates with said second input of said third differential mode opamp and a second end that communicates with said second output of said second differential mode opamp.

58. The amplifier circuit of claim 57 wherein said first, second, third and fourth feedback resistances include at least one of a standard fixed value resistor, a nonlinear variable resistor and a metal-oxide-semiconductor (MOS) resistor.

59. The amplifier circuit of claim 57 wherein said differential mode amplifier circuit is implemented in an optical sensor.

60. The amplifier circuit of claim 57 wherein said differential mode amplifier circuit is implemented in a preamplifier of a hard disk drive.

* * * * *